United States Patent
Lee et al.

(10) Patent No.: US 10,090,840 B1
(45) Date of Patent: Oct. 2, 2018

(54) INTEGRATED CIRCUITS WITH PROGRAMMABLE NON-VOLATILE RESISTIVE SWITCH ELEMENTS

(71) Applicant: Intel Corporation, Santa Clara, CA (US)

(72) Inventors: Andy L. Lee, Sunnyvale, CA (US); Richard G. Smolen, Redwood City, CA (US); Rusli Kurniawan, Belmont, CA (US); Jeffrey T. Watt, Palo Alto, CA (US); Christopher J. Pass, San Jose, CA (US); Yue-Song He, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/637,726

(22) Filed: Jun. 29, 2017

(51) Int. Cl.
*H01L 25/00* (2006.01)
*H03K 19/177* (2006.01)
*G11C 13/00* (2006.01)

(52) U.S. Cl.
CPC ...... *H03K 19/1776* (2013.01); *G11C 13/0011* (2013.01); *G11C 13/0069* (2013.01); *G11C 2013/009* (2013.01)

(58) Field of Classification Search
CPC ............ H03K 19/1776; G11C 13/0011; G11C 13/0069; G11C 2013/009
USPC ........................................................... 326/41
See application file for complete search history.

(56) References Cited

U.S. PATENT DOCUMENTS

| | | | |
|---|---|---|---|
| 7,838,863 B2 | 11/2010 | Zhao et al. | |
| 8,072,237 B1 * | 12/2011 | Rahim | H03K 19/17784 326/101 |
| 8,144,498 B2 | 3/2012 | Kumar et al. | |
| 8,816,312 B2 * | 8/2014 | Tada | G11C 13/0007 257/1 |
| 8,830,727 B2 * | 9/2014 | Yi | G11C 11/56 365/148 |
| 8,890,567 B1 * | 11/2014 | Lewis | H03K 19/17764 326/38 |
| 8,981,332 B2 | 3/2015 | Chiang et al. | |

(Continued)

FOREIGN PATENT DOCUMENTS

| | | | | | |
|---|---|---|---|---|---|
| JP | WO 2017064744 A1 * | 4/2017 | ........... | H03K 19/173 |
| JP | WO 2017195509 A1 * | 11/2017 | ........... | H03K 19/177 |

OTHER PUBLICATIONS

Miyamura et al., "Low-power Programmable-logic Cell Arrays using Nonvolatile Complementary Atom Switch" Low-power Electronics Association & Project (LEAP), Tsukuba, Japan, 15th International Symposium on Quality Electronic Design (ISQED), Mar. 2014, DOI: 10.1109/ISQED.2014.6783344.

(Continued)

*Primary Examiner* — Daniel D Chang

(74) *Attorney, Agent, or Firm* — Treyz Law Group, P.C.; Jason Tsai

(57) ABSTRACT

Integrated circuits with programmable resistive switch elements are provided. A programmable resistive switch element may include two non-volatile resistive elements connected in series and a programming transistor. The programmable resistive switch elements may be configured in a crossbar array and may be interposed within the user data path. Driver circuits may also be included for selectively turning on or turning off the switches by applying positive and optionally negative voltages.

16 Claims, 9 Drawing Sheets

(56) References Cited

U.S. PATENT DOCUMENTS

| | | | |
|---|---|---|---|
| 9,112,138 B2 | 8/2015 | Ramaswamy et al. | |
| 9,419,220 B2 | 8/2016 | Ramaswamy et al. | |
| 9,461,649 B2 | 10/2016 | Cong et al. | |
| 9,589,615 B2 | 3/2017 | Kulkarni et al. | |
| 2017/0331480 A1* | 11/2017 | Bai | H03K 19/09429 |

OTHER PUBLICATIONS

Smolen et al., U.S. Appl. No. 15/624,413, filed Jun. 15, 2017.

* cited by examiner

INTEGRATED CIRCUITS WITH PROGRAMMABLE NON-VOLATILE RESISTIVE SWITCH ELEMENTS

BACKGROUND

Integrated circuits such as programmable integrated circuits often contain volatile memory elements in the form of static random access memory (SRAM) cells. In programmable integrated circuits, SRAM cells may serve as configuration random access memory (CRAM) cells. Programmable integrated circuits are a type of integrated circuit that can be programmed by a user to implement a desired custom logic function. CRAM cells are used to store configuration data supplied by the user. Once loaded, CRAM cells supply control signals to transistors to configure the transistors to implement the desired logic function.

Volatile memory elements such as SRAM and CRAM cells are typically formed using a pair of cross-coupled inverters. In each memory cell, the pair of cross-coupled inverters may be connected to an address transistor that is turned on when data is being read from or written into the memory cell. When no data is being read from or written into the memory cell, the address transistor is turned off to isolate the memory cell.

There is a trend with each successive generation of integrated circuit technology to scale transistors towards smaller sizes, lower threshold voltages, and lower power supply voltages. Lower power supply voltages and smaller devices may lead to decreased read/write margins for volatile memory elements. This can pose challenges for reliable device operation.

Moreover, smaller devices tend to suffer more from process, voltage, and temperature variations (PVT variations). Operating the memory elements at lower power supply voltages can further exacerbate the amount of variation experienced by the memory elements, resulting in reduced memory yield.

It is within this context that the embodiments described herein arise.

DETAILED DESCRIPTION

The present embodiments relate to integrated circuits that include programmable switch elements. The programmable switch elements may be formed using non-volatile resistive elements and can be configured to form any desired connection on an integrated circuit.

Figure 1:
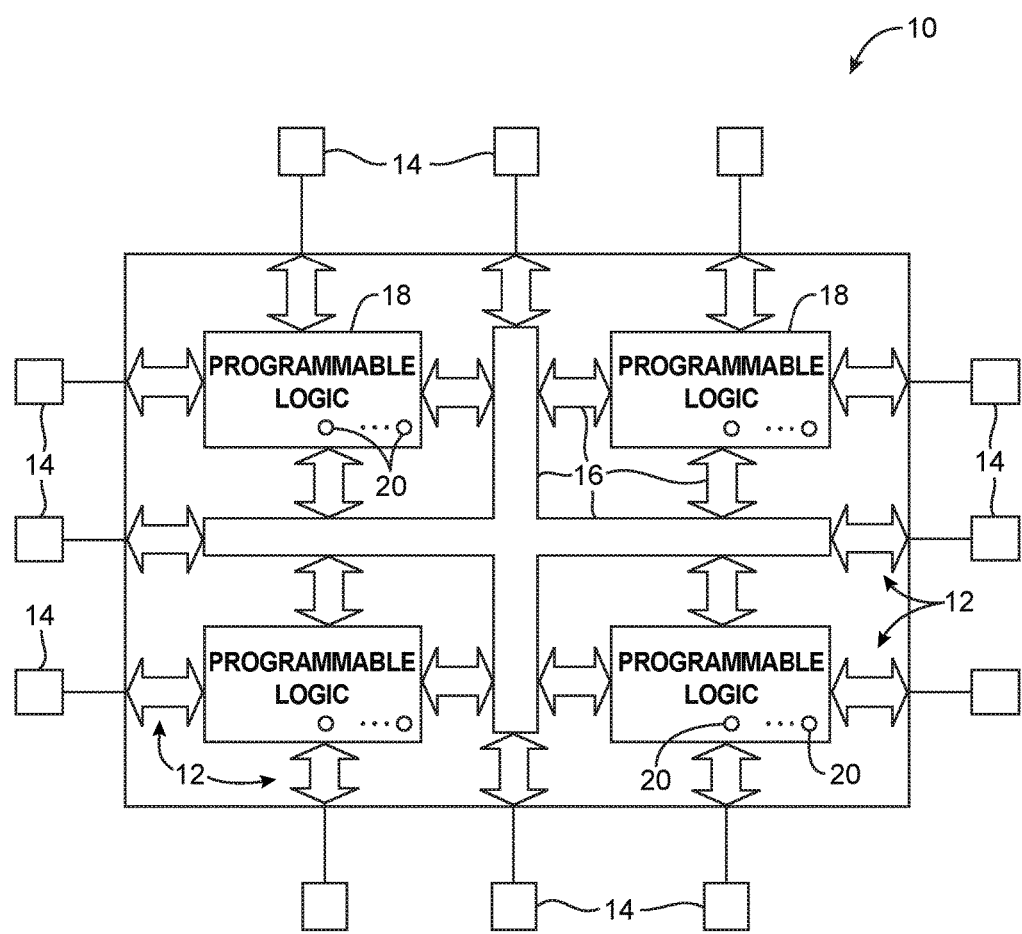
FIG. 1 is a diagram of an illustrative programmable integrated circuit in accordance with an embodiment.

An illustrative integrated circuit 10 that includes programmable switch elements is shown in FIG. 1. Device 10 may have input-output (I/O) circuitry 12 for driving signals off from device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Device 10 contains programmable elements 20. Conventionally, these programmable elements are implemented using configuration random-access memory (CRAM) cells that can be loaded with configuration data using pins 14 and input-output circuitry 12. Once loaded, the configuration memory cells can provide corresponding static control output signals that control the state of an associated logic component in programmable logic 18. Typically, these CRAM memory cells may be used in SRAM-type memory arrays (e.g., to store data for processing circuitry during operation of device 10).

Figure 2:
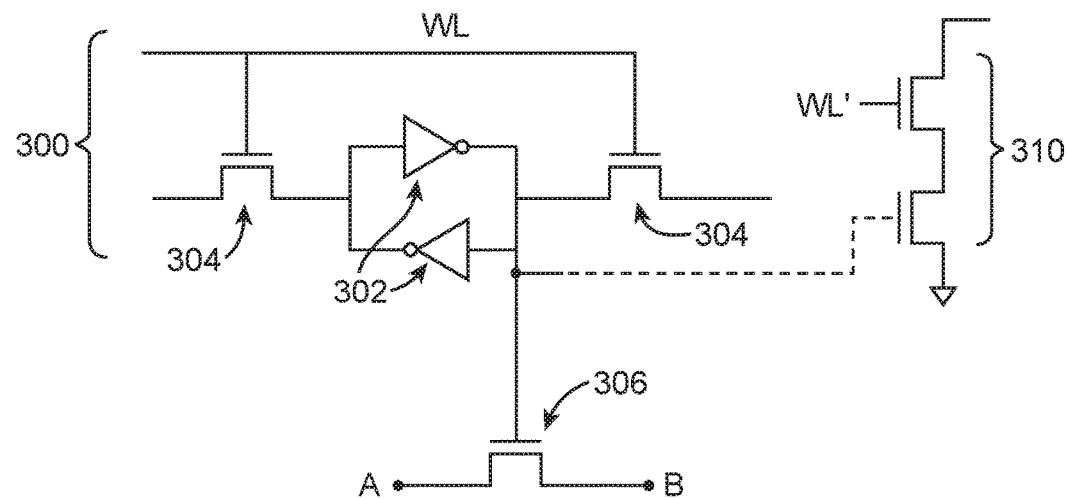
FIG. 2 is a diagram of a configuration random-access memory (CRAM) cell that controls a routing pass gate.

A CRAM cell is formed from a number of transistors configured to form a bistable circuit (see FIG. 2). As shown in FIG. 2, CRAM cell 300 includes cross-coupled inverters 302 connected to access transistors 304. Access transistors 304 are controlled by a word line signal WL for loading data into cell 300 or for reading data out from cell 300. Cell 300 may optionally be read using a read buffer circuit 310. Read buffer circuit 310 may include a first transistor that receives an additional word line signal WL' and a second transistor that is coupled to the bistable circuit. This is merely illustrative. In general, cell 300 may have a 6-transistor configuration, an 8-transistor configuration, a 10-transistor configuration, or other suitable memory cell architecture.

Loaded CRAM memory cell 300 provides a static control signal that is applied to a gate terminal of a corresponding pass gate such as pass transistor 306. If transistor 306 receives a static logic "1" at its gate terminal, user signals will be conveyed from terminal A to terminal B. If, however, transistor 306 receives a static logic "0" at its gate terminal, no signals can flow from terminal A to terminal B via transistor 306. By loading the desired configuration data into cell 300, pass transistor 306 can be selectively turned on or off to configure the logic in programmable logic 18.

CRAM cell 300 of FIG. 2 is a volatile memory element. A volatile memory element retains data only so long as the integrated circuit is powered. In the event of power loss, the data in the volatile memory element is lost. Volatile memory elements are subject to a phenomenon known as soft error upset ("SEU"). Soft error upset events are caused by cosmic rays and radioactive impurities embedded in integrated circuits and their packages. Cosmic rays and radioactive impurities generate high-energy atomic particles such as neutrons and alpha particles. The memory elements contain transistors and other components that are formed from a patterned silicon substrate. When an atomic particle strikes the silicon in the memory element, electron-hole pairs are generated. The electron-hole pairs create a conduction path that can cause a charged node in the memory element to discharge and the state of the memory element to flip. If, for example, a logic "1" was stored in the memory element, an SEU event could cause the logic "1" to change to a logic "0".

Upset events in an integrated circuit corrupt the data stored in the memory elements and can have serious repercussions for system performance and system functionality. In certain system applications, such as remote installations of telecommunications equipment, it is extremely burdensome to repair faulty equipment. Unless integrated circuits demonstrate good immunity to soft error upset events, they will be unsuitable for these types of applications.

Figure 3:
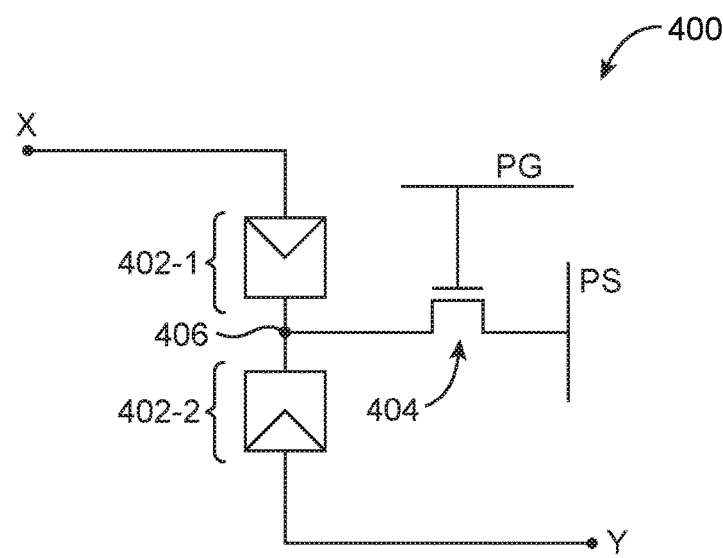
FIG. 3 is a diagram of an illustrative programmable resistive switch element in accordance with an embodiment.

In accordance with an embodiment, integrated circuit device 10 is provided with programmable elements 20 implemented using non-volatile resistive elements (e.g., elements that retain their state regardless if device 10 is supplied with power). FIG. 3 is a diagram of an illustrative programmable resistive switch element such as switching element 400 in accordance with an embodiment. As shown in FIG. 3, programmable resistive switch element 400 may include a first non-volatile resistive element 402-1 and a second non-volatile resistive element 402-2 coupled in series between a first terminal X and a second terminal Y.

In particular, resistive element 402-1 may have a first (anode) terminal that is connected to terminal X and a second (cathode) terminal that is connected to intermediate node 406. Resistive element 402-2 may have a first (anode) terminal that is connected to terminal Y and a second (cathode) terminal that is connected to node 406. This arrangement in which the cathode of resistive element 402-1 is connected to and facing the cathode of resistive element 402-2 is sometimes referred to as a "back-to-back" configuration.

An access transistor such as transistor 404 may be coupled between a data line (e.g., a data line on which programming source voltage PS is provided) and node 406. Transistor 404 may be activated using programming gate signal PG help program switch 400 in a desired state. Transistor 404 is therefore sometimes referred to as a programming transistor.

Switch 400 configured in this way may replace the entire CRAM and pass gate combination shown in FIG. 2. Compared to the circuitry of FIG. 2 (which includes at least six transistors in CRAM cell 300 and one additional pass gate transistor 306), switch 400 of FIG. 3 includes only three components (e.g., programming transistor 404 and resistive elements 402-1 and 402-2) and may therefore require less circuit area. Programmable switch 400 may, as an example, be part of a routing multiplexer for routing active user signals from a first logic region to a second logic region on the integrated circuit (e.g., from a first logic region connected to terminal X to a second logic region connected to terminal Y), part of a programmable switch in a lookup table, or part of other configurable logic circuitry 18 on the integrated circuit. In other words, terminals X and Y and resistive elements 402-1 and 402-2 are interposed in the user data path. Since terminals X and Y lie along the user data path, they cannot be tied to fixed power supply lines.

Each resistive element 402 (e.g., resistive elements 402-1 and 402-2) may be a two-terminal electrochemical metallization memory device that relies on redox reactions to form (i.e., to "program") or to dissolve (i.e., to "erase") a conductive filament between the two terminals. The presence of a conductive filament between the two terminals produces a low resistance state (LRS), whereas the absence of the conductive filament between the two terminals produces a high resistance state (HRS). In LRS, the resistive element is sometimes referred to as being shorted or closed (i.e., activated, set, or programmed). In the HRS, the resistive element is sometimes referred to as being open or deactivated (i.e., switched out of use, reset, or erased). Resistive element 402 configured in this way is sometimes referred to as a programmable metallization cell (PMC) or a conductive-bridging RAM (CBRAM). If desired, magnetic RAM elements, other types of resistive RAM elements (RRAM), might also be used. A programmable switch configured using PMC elements in this way may exhibit nonvolatile behavior, soft error upset immunity, and zero standby current. Moreover, by connecting two resistive elements in series, the voltage level across each resistive element is halved during normal use, which reduces the possibility of accidentally setting or resetting each resistive element.

Switch 400 may either be configured in a first conducting mode to conduct signals between terminals X and Y or in a second non-conducting mode to prevent signals from flowing between terminals X and Y. To configure switch 400 in the first mode, both elements 402-1 and 402-2 need to be set (i.e., both resistive elements should be closed and conducting). Consider a scenario in which user signals toggle between nominal positive voltage level Vcc and ground voltage level Vss. Voltage level Vcc may be equal to 1.2 V, 1.1 V, 1.0V, 0.9 V, less than 0.9 V, greater than 1.2 V, or any other suitable voltage. Ground voltage Vss may be equal to 0 V, +0.1 V, −0.1 V, or other suitable ground reference level. To set the top resistive element 402-1, terminal X may be driven high to 2*Vcc while programming transistor 404 is turned on to bias node 406 to ground and while terminal Y is in a high impedance state (i.e., terminal Y is not actively driven to any particular voltage level). Applying an elevated positive voltage across the anode-to-cathode terminals will program element 402-1 in the LRS. To set the bottom resistive element 402-2 in the LRS, terminal Y may be driven high to 2*Vcc while programming transistor 404 is turned on to bias node 406 to ground and while terminal X is in a high impedance state. In yet other suitable embodiments, the programming voltage may be at least 1.5*Vcc, at least 1.8*Vcc, or more than 2*Vcc.

To configure switch 400 in the second non-conducting mode, both elements 402-1 and 402-2 need to be reset (i.e., both resistive elements should be open and non-conducting). To reset top resistive element 402-1, terminal X may be driven low to Vss while programming transistor 404 is turned on to bias node 406 to 2*Vcc and while terminal Y is in a high impedance state. Applying an elevated negative voltage across the anode-to-cathode terminals will program element 402-1 in the HRS. To reset bottom resistive element 402-2 in the HRS, terminal Y may be driven to Vss while programming transistor 404 is turned on to bias node 406 to 2*Vcc and while terminal X is in a high impedance state.

As described above, a programming operation may require a total voltage of 2*Vcc across resistive element 402. For example, an erase operation may require at least 2*(−Vcc) across the anode and cathode terminals. On the other hand, a set operation may require at least 2*(+Vcc) across the anode and cathode terminals. Only programming transistor 404 may be exposed to a total voltage stress of 2*(+Vcc), since during programming, it will receive 2*Vcc at its gate and Vss (e.g., zero volts) from the data line.

While operating at elevated voltage levels of 2*Vcc may be tolerable to a certain extent, limiting the voltage applied to the user logic drivers can obviate the need for thick-oxide transistors. In another suitable arrangement, the programming voltage may be split between the positive rail +Vcc and a negative rail −Vcc (e.g., both rails have the same magnitude).

For example, to configure switch 400 in the first conducting mode, both resistive elements 402-1 and 402-2 needs to be placed in LRS. Top resistive element 402-1 can be set by driving terminal X to +Vcc while transistor 404 applies −Vcc to node 406 and while terminal Y is floating. Voltages +Vcc and −Vcc have the same magnitude that is equal to the nominal core voltage Vcc. Similarly, bottom resistive element 402-2 can be set by driving terminal Y to +Vcc while transistor 404 applies −Vcc to node 406 and while terminal X is floating.

Alternatively, to configure switch 400 in the second non-conducting mode, both resistive elements 402-1 and 402-2 needs to be placed in HRS. Top resistive element 402-1 can be reset by driving terminal X to −Vcc while transistor 404 applies +Vcc to node 406 and while terminal Y is floating. Similarly, bottom resistive element 402-2 can be reset by driving terminal Y to −Vcc while transistor 404 applies +Vcc to node 406 and while terminal X is floating.

By splitting the programming voltage between the positive rail (+Vcc) and the negative rail (−Vcc) on either side of resistive element 402, all circuits associated with switch 400 may be implemented using core transistor devices (e.g., transistors having the thinnest gate oxide thickness allowed by the current fabrication design rules). Typically, input-output circuits (e.g., I/O circuits 12 of FIG. 1) are formed using input-output transistor devices having relatively thicker gate oxides compared to the core transistor devices so that the I/O transistors are able to withstand higher voltage stress (i.e., thicker gate oxides exhibit greater junction and gate oxide breakdown voltage levels). Using primarily core transistors on device 10 can help reduce die area while improving or at least maintaining reliability.

Conventional implementation of programmable routing fabric on a programmable integrated circuit device relies on high fan-in multiplexers. The fan-in of these routing multiplexers are typically in the range of 6 to 40 inputs. In most cases where these routing multiplexers are implemented, the connection population or density is very limited and achieves nowhere near a full crossbar connection capability.

Figure 4:
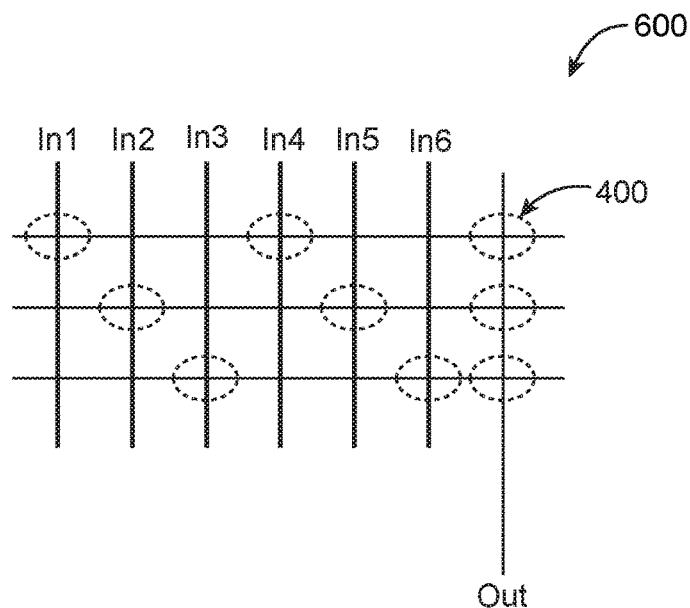
FIG. 4 is a diagram of a two-stage multiplexing circuit that is implemented using programmable resistive switch elements of the type shown in FIG. 3 in accordance with an embodiment.

Oftentimes, a two-stage multiplexing configuration is used since it provides the most area efficient implementation in terms of CRAM cell count and pass-gate count, because CRAM cell contents can be shared among multiple pass-gates in at least one of the two multiplexing stages. FIG. 4 is a diagram of a two-stage multiplexing circuit 600. As shown in FIG. 4, multiplexer 600 is a 6:1 multiplexer having six inputs In1-In6 and one output Out. Switches may be formed at specific intersections (as shown in the dotted regions in FIG. 4) and depending on the state of these switches, multiplexer 600 may be configured to route signals from a selected one of its six inputs to its output.

In the example of FIG. 4, each of these switches may be implemented using a programmable resistive switch element 400 (see, e.g., FIG. 3) instead of the CRAM plus pass-gate combination of FIG. 2. If switch element 400 is used, it would no longer be necessary to implement two-stage multiplexing since it is no longer more area efficient (i.e., because the two-stage multiplexer uses more switches than a single-stage direct-connection arrangement and because switch element 400 does not need to be controlled by a CRAM cell).

Figure 5:
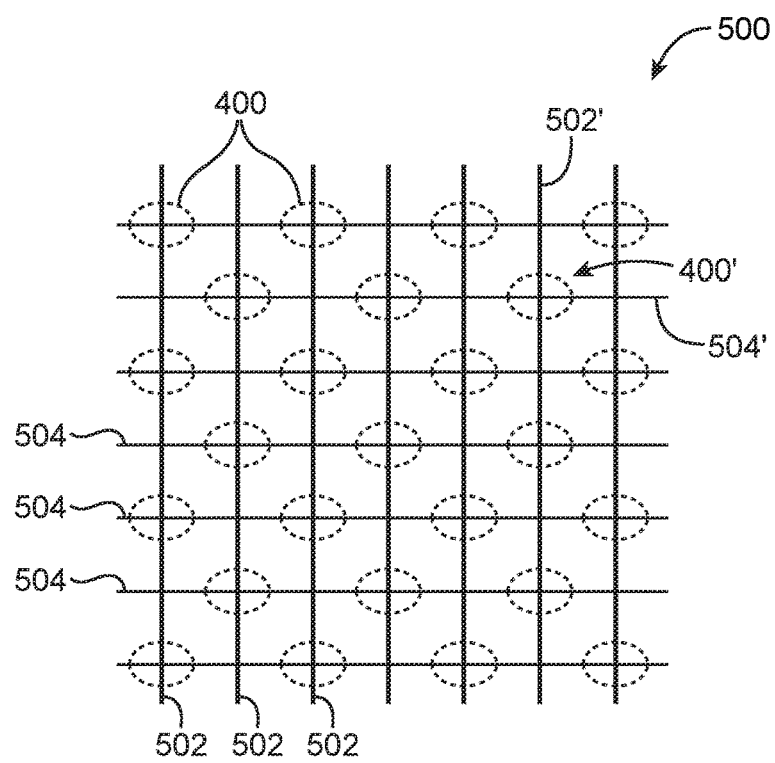
FIG. 5 is a diagram of a single-stage crossbar switch matrix that is implemented using programmable resistive switch elements of the type shown in FIG. 3 in accordance with an embodiment.

In accordance with an embodiment, a direct connection between input and output routing lines that uses a single programmable resistive switch 400 can be implemented. FIG. 5 is a diagram of a single-stage crossbar switch matrix 500 that is implemented using programmable resistive switch elements 400. As shown in FIG. 5, multiple vertical routing lines 502 may overlap with horizontal routing lines 504. For example, switch 400' may be configured to selectively route signals from vertical line 502' to horizontal line 504', or vice versa (e.g., switch 400' may directly connect line 502' to line 504').

The arrangement of FIG. 5 in which a switch 400 is formed at every other intersection between lines 502 and 504 is merely illustrative. If desired, switch 400 may be formed at every single intersection or any subset of the intersections in a regular or non-regular pattern. Since each programmable resistive switch element 400 does not require a separate CRAM cell for controlling its state, single-stage crossbar 500 implemented in this way utilizes fewer total switch elements and smaller overall circuit area.

Conventional multiplexing configurations are implemented as a distributed global network of different routing wire types. In particular, multiple metal routing layers are used for different routing interconnect signals and are allowed to cross over each other across the entire integrated circuit. Since any multiplexer connection requires connecting to transistors formed in the wafer substrate, there is no benefit to limiting certain types of connections to certain regions on the integrated circuit.

Figure 6:
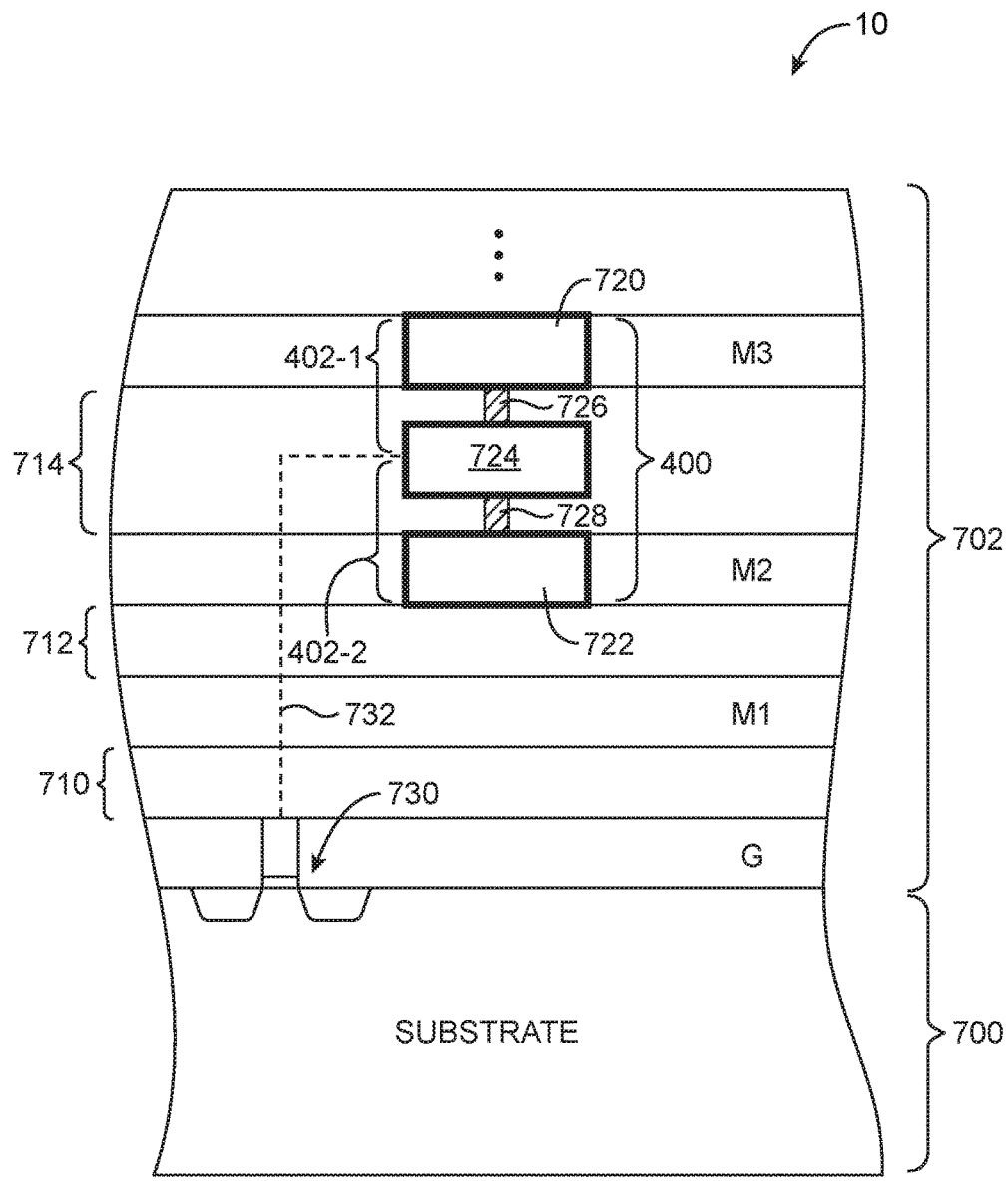
FIG. 6 is a cross-sectional side view of an illustrative programmable resistive switch element that is formed in a dielectric stack of an integrated circuit in accordance with an embodiment.
Figure 9:
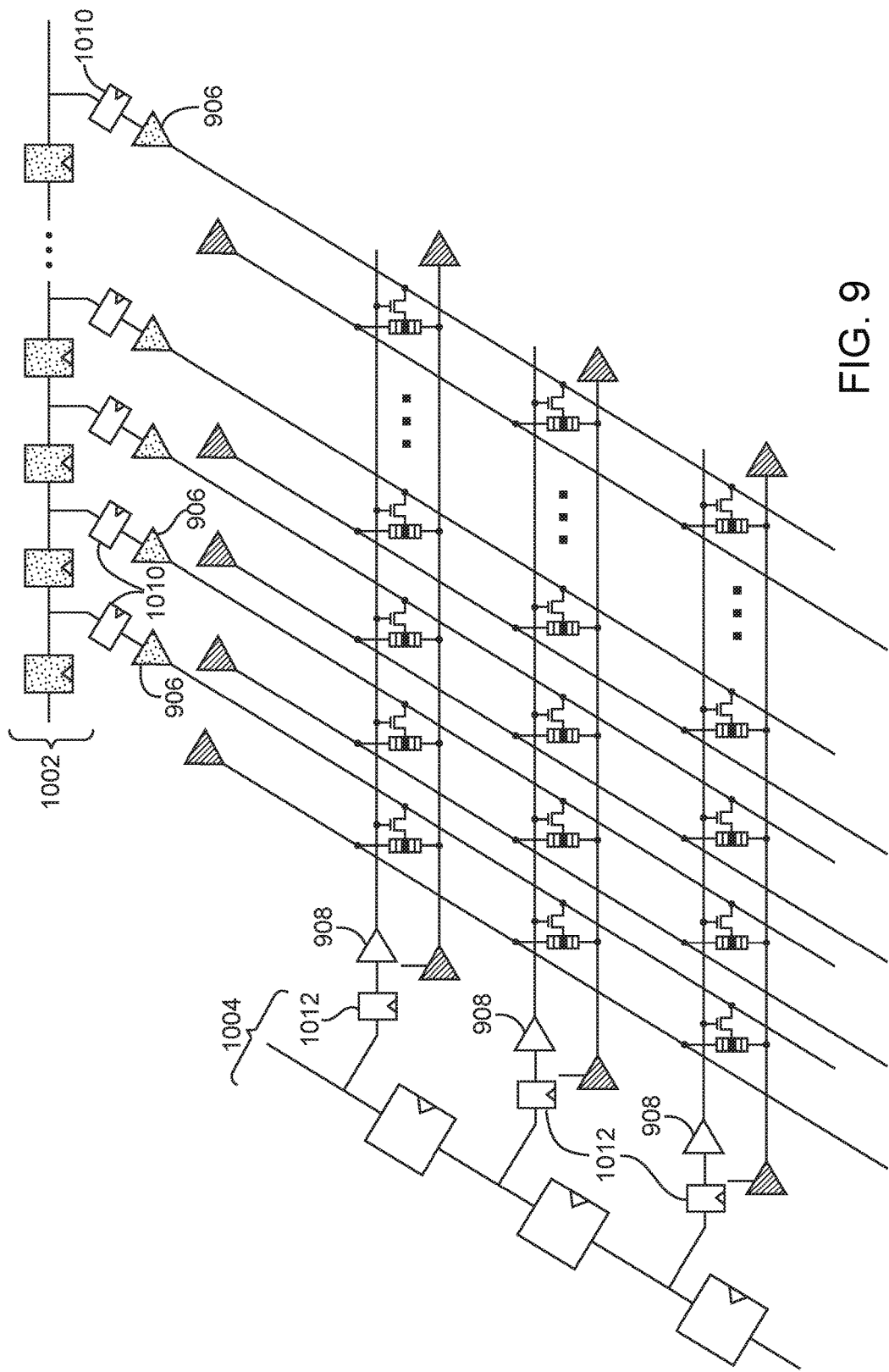
FIG. 9 is a diagram showing shift register circuitry that is used for setting configuration signals in accordance with an embodiment.

In contrast to conventional multiplexing schemes that rely on transistors formed in the wafer substrate, programmable resistive switch element 400 could be chosen to exist on only a few metal routing layers. FIG. 6 is a cross-sectional side view of an illustrative programmable resistive switch element 400 that is formed in a dielectric stack 702 of integrated circuit 10. As shown in FIG. 9, dielectric stack 702 may be formed on a semiconductor substrate 700 (e.g., a p-type silicon substrate). Dielectric stack 902 may include alternating conductive routing layers and via layers and is sometimes referred to as an interconnect stack.

Dielectric stack 702 may include a gate (G) routing layer (e.g., a gate layer in which transistor gate conductors are formed). A first metal routing layer M1 may be formed above the gate layer. A second metal routing layer M2 may be formed above the M1 layer. A third metal routing layer M3 may be formed above the M2 layer, and so on. A first via layer 710 may be interposed between the gate layer and the M1 layer. Conductive vias or "contacts" may be formed in layer 710 for connecting gate conductors in the gate layer to routing paths in the M1 layer. A second via layer 712 may be interposed between the M1 and M2 layers. Conductive vias may be formed in layer 712 for connecting routing paths in the M1 layer to routing paths in the M2 layer. Similarly, a third via layer 714 may be interposed between the M2 and M3 layers. Conductive vias may be formed in layer 714 for connecting routing paths in the M2 layer to routing paths in the M3 layer. In general, integrated circuit 10 may include any number of metal routing layers (e.g., at least five metal routing layers, at least eight metal routing layers, at least 10 metal routing layers, etc.).

In the example of FIG. 6, programmable resistive switch element 400 may only be formed within the M2 and M3 metal layers. Conductive structure 720 in the M3 metal layer may serve as the anode terminal of resistive element 402-1, whereas conductive structure 722 in the M2 metal layer may serve as the anode terminal of resistive element 402-2. Conductive structure 724 may be formed between the M2 and M3 metal layers and may serve as a shared cathode terminal for both resistive elements 402. Conductive filament 726 may short structures 720 and 724 when resistive element 402-1 is in LRS. Similarly, conductive filament 728 may short structures 722 and 724 when resistive element 402-2 is in LRS. The shared cathode terminal 724 may be coupled to transistor 730 (e.g., a programming transistor formed in substrate 700) via dotted path 732.

If switch elements 400 can only be formed on the M2 and M3 metal layers, it is likely that the programmable routing fabric should be modified to utilize a more localized crossbar switch configuration (e.g., there may be an advantage to localizing certain connection types to certain metal layers). For instance, making a connection between two wires might require forming a via down to the targeted M2/M3 metal layers from the nominal metal layer in which it is currently residing on.

Figure 7:
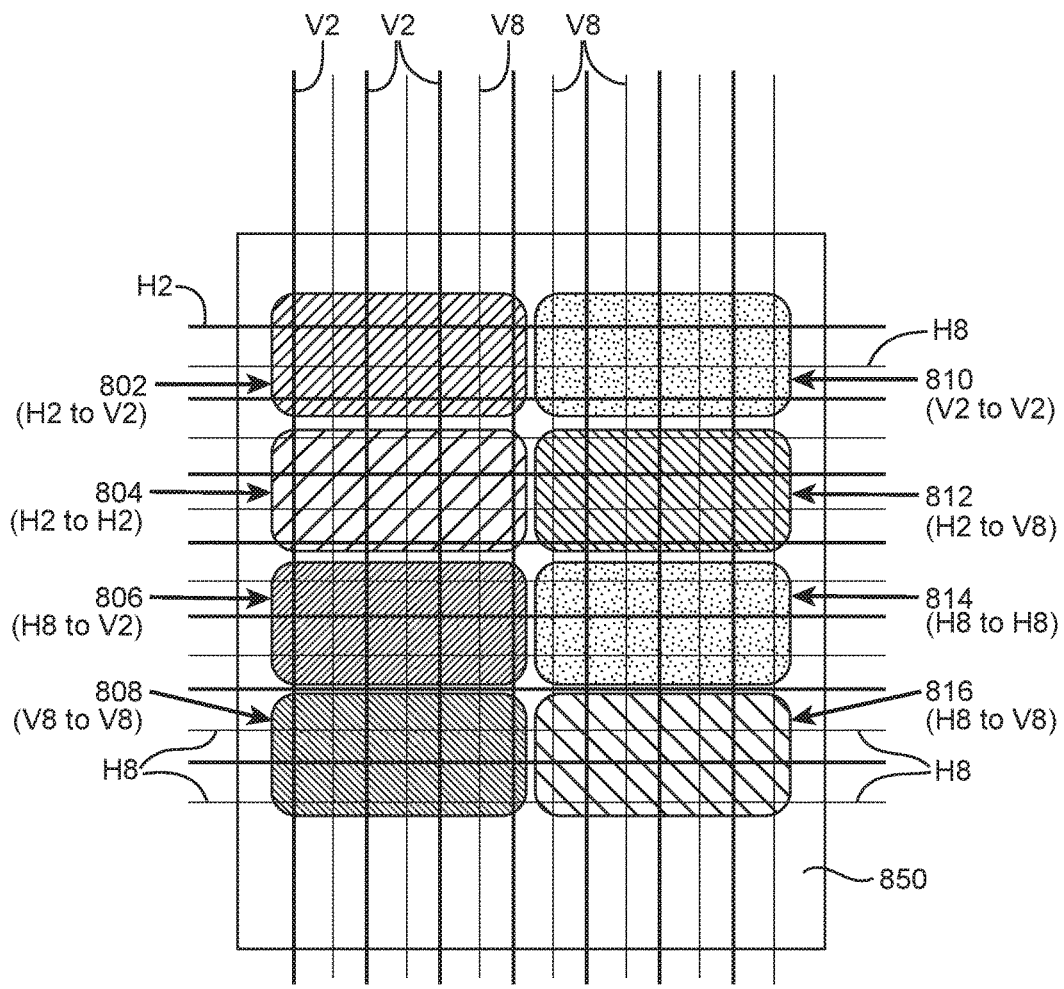
FIG. 7 is top layout view showing how crossbar connections can be organized into localized regions in accordance with an embodiment.

FIG. 7 is top layout view showing how crossbar connections can be organized into localized regions. As shown in FIG. 7, vertical and horizontal wires may be routed over a given logic tile 850. Logic "tile" 850 may represent a repeatable logic building block on device 10. The vertical wires may include a first group of vertical wires V2 and a second group of vertical wires V8, whereas the horizontal wires may include a first group of horizontal wires H2 and a second group of horizontal wires H8. The V2 wires may traverse at least two tiles in the vertical direction, whereas the V8 wires may traverse at least eight tiles in the vertical direction. The H2 wires may traverse at least two tiles in the horizontal direction, whereas the H8 wires may traverse at least eight tiles in the horizontal direction. In general, vertical and horizontal wires of any suitable length may be formed over tile 850. Wires H2 and V2 may be formed in higher metal layers (e.g., in the M4 or M5 metal layers). Wires H8 and V8 may be formed in even higher metal layers (e.g., in the M6 or M7 metal layers).

In the example of FIG. 7, connections between the same two types of wires may be clustered into localized regions. The H2-to-V2 wire connections may be localized to crossbar sub-region 802. In sub-region 802, the H2 and V2 wires will have to via down to the M2/M3 metal layers from each of their respective metal layers to make contact with switches 400. The H2-to-H2 wire connections may be localized to crossbar sub-region 804. In sub-region 804, the H2 and H2 wires will have to via down to the M2/M3 metal layers from each of their respective metal layers to make contact with switches 400. The H8-to-H2 wire connections may be localized to crossbar sub-region 806. In sub-region 806, the H8 and H2 wires will have to via down to the M2/M3 metal layers from each of their respective metal layers. The V8-to-V8 wire connections may be localized to crossbar sub-region 808. In sub-region 808, the V8 and V8 wires will have to via down to the M2/M3 metal layers from each of their respective metal layers.

The V2-to-V2 wire connections may be localized to crossbar sub-region 810. In sub-region 810, the V2 and V2 wires will have to via down to the M2/M3 metal layers from each of their respective metal layers. The H2-to-V8 wire connections may be localized to crossbar sub-region 812. In sub-region 812, the H2 and V8 wires will have to via down to the M2/M3 metal layers from each of their respective metal layers. The H8-to-H8 wire connections may be localized to crossbar sub-region 814. In sub-region 814, the H8 and H8 wires will have to via down to the M2/M3 metal layers from each of their respective metal layers. The H8-to-V8 wire connections may be localized to crossbar sub-region 816. In sub-region 816, the H8 and V8 wires will have to via down to the M2/M3 metal layers from each of their respective metal layers. As shown in FIG. 7, these localized regions over the substrate may all be non-overlapping.

Routing fabric configured in this way can best leverage the programmable resistive switch technology whenever switch 400 is only limited to specific layers in the dielectric stack. The exemplary routing arrangement described in connection with FIGS. 6-7 in which switch elements 400 can only be formed in the M2 and M3 metal layers are merely illustrative. In general, programmable resistive switch elements 400 may be formed in only one metal layer, in three or more metal layers, in four or more metal layers (e.g., a first group of switches 400 might be formed in layers M2 and M3, whereas a second group of switches is formed in layers M4 and M5), etc.

Figure 8:
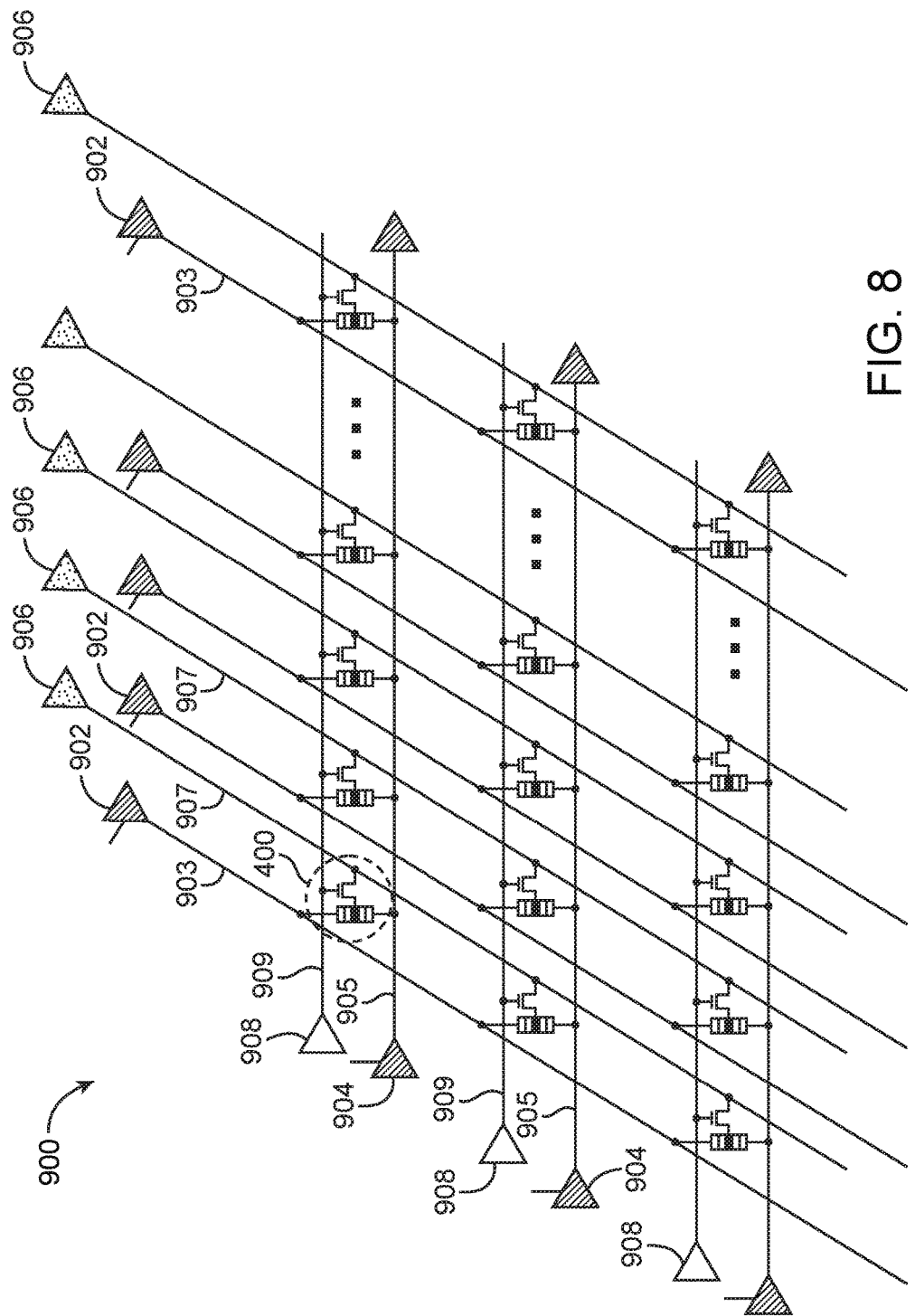
FIG. 8 is a diagram showing an array of programmable resistive switch elements that are controlled by peripheral driver circuits in accordance with an embodiment.

As described above in connection with FIG. 3, programmable resistive switch element 400 obviates the need for a separate independently-addressable CRAM array to hold configuration data. Switch element 400, however, still needs to be programmed using global and/or local control signals. To reduce total area and signal cost overhead, existing wiring and buffers that are used for the programmable user logic may be re-used to configure these switches. FIG. 8 is a diagram showing an array such as array 900 of programmable resistive switch elements 400 that are coupled to peripheral driver circuits, which can be used to independently program each of switch elements 400 in array 900. Array 900 may implement a crossbar switch (see, e.g., FIG. 5).

As shown in FIG. 8, there may be at least three types of driver circuits. A first type includes user logic driver circuits 902 and 904. Each driver 902 may be configured to drive a respective column line 903 that is coupled to the anode terminal of the top resistive element in each switch 400 coupled to that column line. Each driver 904 may be configured to drive a respective row line 905 that is coupled to the anode terminal of the bottom resistive element in each switch 400 coupled to that row line. Lines 903 and 905 that are driven by driver circuits 902 and 904 are user wires that are actually connected to other user circuitry, so it may be advantageous to leverage existing programmable logic elements to help reduce cost of programming these switches 400.

The terms "rows" and "columns" merely refer to one way of orienting the components in array 900 and can be used interchangeably. Lines 903 and 905 are shown in FIG. 8 as being orthogonal to each other. In other suitable embodiments, lines 903 and 905 need not be perpendicular and may instead be parallel or may intersect each other at an acute or obtuse angle.

A second type of driver includes programming source driver circuits 906. Drivers 906 generate the programming source (PS) signals that are then fed to data lines 907. Each data line 907 is coupled to the source terminal of the programming transistor in each switch 400 coupled to that data line.

A third type of driver includes programming gate driver circuits 908. Drivers 908 generate the programming gate (PG) signals that are then fed to gate lines 909. Each gate line 909 is coupled to the gate terminal of the programming transistor in each switch 400 coupled to that gate line. The example of FIG. 8 in which lines 907 and 909 are shown as being orthogonal to each other is merely illustrative. In other suitable embodiments, lines 907 and 909 need not be perpendicular and may instead be parallel or may intersect each other at an acute or obtuse angle.

In one suitable arrangement, drivers 902, 904, 906, and 908 may be configured to output signals between Vss and 2*Vcc to perform set/reset operations to place switches 400 in either the conducting mode (i.e., to turn on switch 400) or the non-conducting mode (i.e., to turn off switch 400), as described above in connection with FIG. 3.

In another suitable arrangement, negative voltage levels can be leveraged to reduce the overall voltage differential across thin-oxide data path transistors. For example, drivers 902, 904, 906, and 908 may be configured to output signals between +Vcc and −Vcc to perform set/reset operations to place switches 400 in either the conducting or non-conducting mode. Using negative voltages may allow thin-oxide devices to be used for the user data path logic, thereby improving area, speed, and power of the overall circuitry.

If desired, driver circuits 902 and 904 may be tristate buffers. When drivers 902 and 904 are in tristate mode, they will not actively drive their outputs (e.g., their outputs are allowed to be electrically floating in a high impedance state). When drivers 902 and 904 are in normal active mode, they will actively drive their outputs high (e.g., to 2*Vcc, Vcc, or other positive power supply voltage level) or low (e.g., to Vss, −Vcc, or other ground/negative power supply voltage level). By having the capability to tristate user logic drivers during programming, voltages applied to switches that are not currently being programmed can be better controlled (e.g., to help avoid inadvertently programming unintended switches).

FIG. 9 is a diagram showing shift register circuitry that can be used for setting the configuration signals. As shown in FIG. 9, shift register 1002 may be used to load a series of programming source signals. The programming source signals may be latched using shadow registers 1010. Each shadow register 1010 may provide the latched programming source signal to a corresponding programming source driver 906. For example, shadow register 1010 storing a high bit may cause the corresponding driver 906 to output either 2*Vcc or Vcc (if using a split voltage scheme). Shadow register 1010 storing a low bit may cause the corresponding driver 906 to output either Vss or −Vcc (if using the split voltage scheme).

Similarly, shift register 1004 may be used to load a series of programming gate signals. The programming gate signals may be latched using shadow registers 1012. Each shadow register 1012 may provide the latched programming gate signal to a corresponding programming gate driver 908. For example, shadow register 1012 storing a high bit may cause the corresponding driver 908 to output either 2*Vcc or Vcc (if using a split voltage scheme). Shadow register 1012 storing a low bit may cause the corresponding driver 908 to output either Vss or −Vcc (if using the split voltage scheme).

Figure 10:
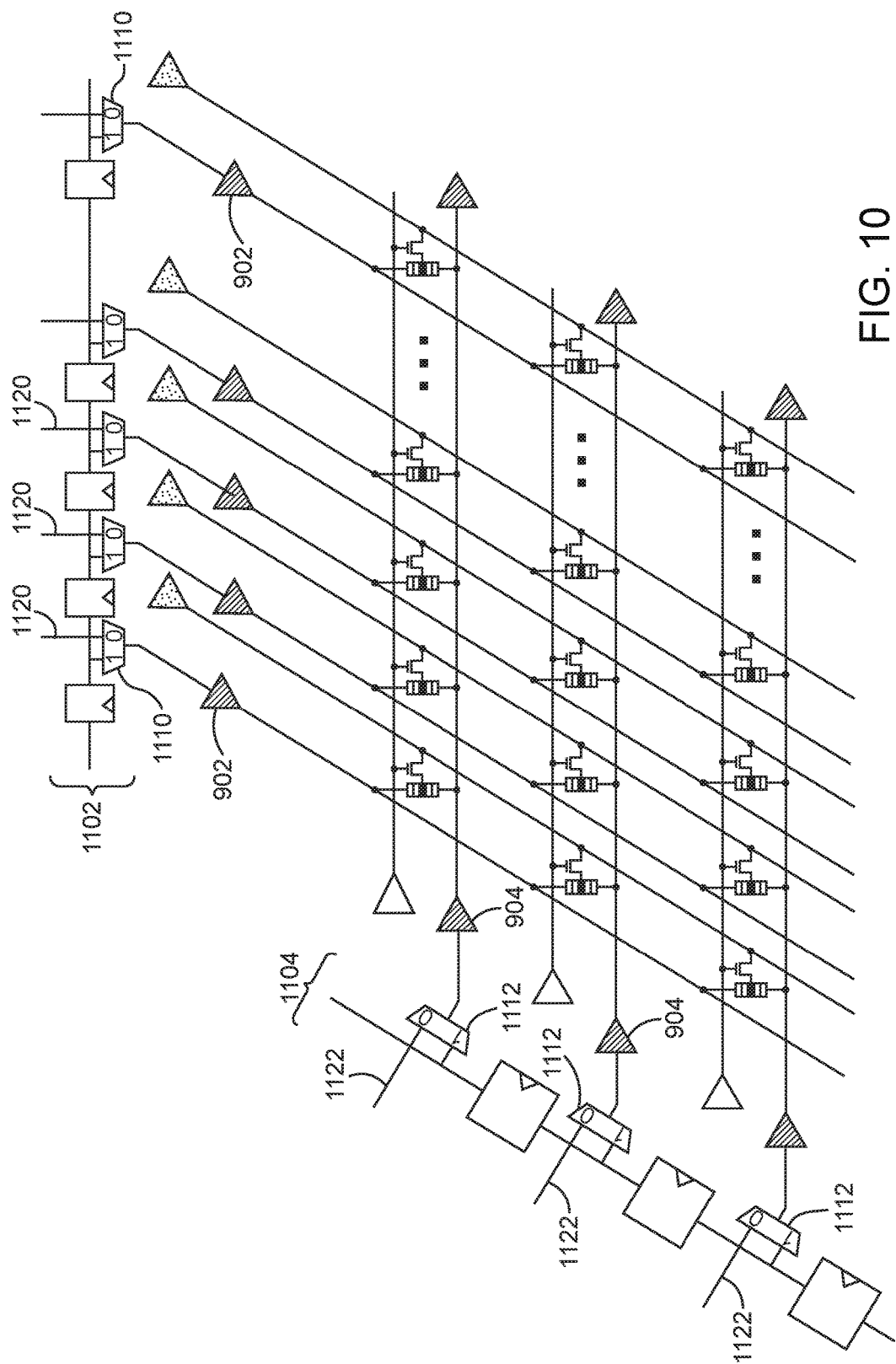
FIG. 10 is a diagram showing shift register circuitry that is used for overriding user logic signals in accordance with an embodiment.

FIG. 10 is a diagram showing shift register circuitry that can be used for overriding the user logic signals. As shown in FIG. 10, shift register circuitry 1102 may include a chain of shift registers and associated multiplexers 1110 coupled to the output of each individual shift register. Multiplexer 1110 may have a first (0) input that is coupled to a corresponding user data path 1120, a second (1) input that receives signals from a corresponding shift register in the chain, and an output that is coupled to a corresponding driver 902 (e.g., a tristate buffer). Multiplexer 1110 may be configured to route signals from its first input to its output during normal user mode and may also be configured to route signals from its second input to its output during programming mode to load in the programming data stored in shift register circuitry 1102.

Similarly, shift register circuitry 1104 may include a chain of shift registers and associated multiplexers 1112 coupled to the output of each individual shift register. Multiplexer 1112 may have a first (0) input that is coupled to a corresponding user data path 1122, a second (1) input that receives signals from a corresponding shift register in the chain, and an output that is coupled to a corresponding driver 904 (e.g., a tristate buffer). Multiplexer 1112 may be configured to route signals from its first input to its output during normal user mode and may also be configured to route signals from its second input to its output during programming mode to load in the programming data stored in shift register circuitry 1104.

Figure 11:
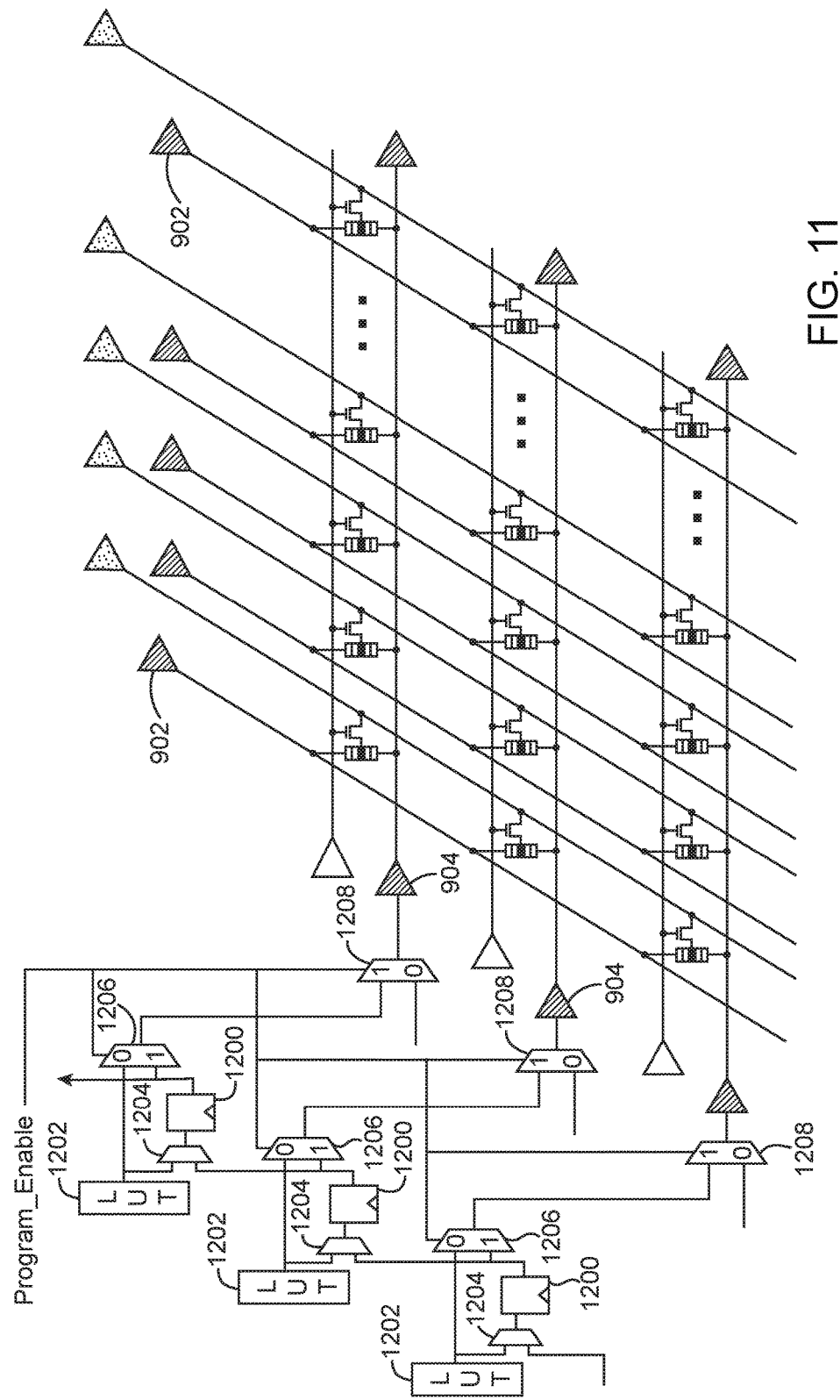
FIG. 11 is a diagram of an illustrative scan chain that is part of existing logic circuitry and that can be leveraged for overriding user logic signals in accordance with an embodiment.

Instead of adding additional shift register hardware at the boundary of the switch array, another option is to utilize the existing logic circuitry that is already capable of driving input signals onto these user data paths. Programmable integrated circuits often include register scan and shifting logic for testing purposes. By reusing this capability to override user values, the same signal control can be achieved opportunistically without having to add additional shift registers. FIG. 11 is a diagram of an illustrative scan chain that is part of existing logic circuitry and that can be leveraged to override user logic signals in accordance with an embodiment.

As shown in FIG. 11, programmable logic circuitry such as lookup tables (LUTs) 1202 may be coupled to drivers 904 via multiplexers 1204, 1206, and 1208. A first LUT 1202 may output user signals for driver 904 in a first row. A second LUT 1202 may output user signals for driver 904 in a second row. A third LUT 1202 may output user signals for driver 904 in a third row. First multiplexer 1206 may have a first (0) input that receives signals from first LUT 1202, and, a second (1) input that receives signals from a first scan chain register 1200, and an output. Second multiplexer 1206 may have a first (0) input that receives signals from second LUT 1202, a second (1) input that receives signals from a second scan chain register 1200, and an output. Third multiplexer 1206 may have a first (0) input that receives signals from third LUT 1202, a second (1) input that receives signals from a third scan chain register 1200, and an output.

A first multiplexer 1204 may have a first input that receives signals from first LUT 202, a second input that receives signals from second scan chain register 1200, and an output that is coupled to first scan chain register 1200. A second multiplexer 1204 may have a first input that receives signals from second LUT 202, a second input that receives signals from third scan chain register 1200, and an output that is coupled to second scan chain register 1200. A third multiplexer 1204 may have a first input that receives signals from third LUT 202, a second input that receives signals from a fourth scan chain register 1200 (not shown), and an output that is coupled to third scan chain register 1200.

A first multiplexer 1208 may have a first (0) input that is coupled to other logic circuitry, a second (1) input that is coupled to the output of first multiplexer 1206, and an output that is coupled to driver 904 in the first row. A second multiplexer 1208 may have a first (0) input that is coupled to other logic circuitry, a second (1) input that is coupled to the output of second multiplexer 1206, and an output that is coupled to driver 904 in the second row. A third multiplexer 1208 may have a first (0) input that is coupled to other logic circuitry, a second (1) input that is coupled to the output of third multiplexer 1206, and an output that is coupled to driver 904 in the third row. The connection between multiplexer 1208 and driver 904 need not be a direct connection, but may be a programmable routing connection that is selectively enabled by the user during device configuration.

Multiplexers 1206 and 1208 may have control inputs that receive program enable signal Program_Enable. When signal Program_Enable is asserted (i.e., when the program enable signal is driven high), signals from the scan chain registers 1200 may be allowed to pass through to drivers 904 to help set/reset the programmable resistive switch elements. When signal Program_Enable is deasserted (i.e., when the program enable signal is driven low), user signals from LUTs 1202 will pass through to drivers 904. Although FIG. 11 only shows circuitry associated with providing programming signals to drivers 904, similar circuitry may also be implemented for drivers 902, 906, and/or 908.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

EXAMPLES

The following examples pertain to further embodiments.

Example 1 is an integrated circuit, comprising: a first logic region; a second logic region; a data path configured to convey signals from the first logic region to the second logic region; and a programmable resistive switch element interposed in the data path, the programmable resistive switch element comprises a first non-volatile resistive element and a second non-volatile resistive element coupled in series between the first logic region and the second logic region.

Example 2 is the integrated circuit of example 1, wherein the first non-volatile resistive element has a cathode terminal, and wherein the second non-volatile resistive element has a cathode terminal that is coupled to the cathode terminal of the first non-volatile resistive element.

Example 3 is the integrated circuit of example 2, wherein the programmable resistive switch element further comprises a programming transistor coupled to the cathode terminals of the first and second non-volatile resistive elements.

Example 4 is the integrated circuit of example 3, further comprising: a first driver circuit configured to drive an anode terminal of the first non-volatile resistive element; and a second driver circuit configured to drive an anode terminal of the second non-volatile resistive element.

Example 5 is the integrated circuit of example 4, wherein the first and second driver circuits are tristate buffer circuits.

Example 6 is the integrated circuit of example 4, further comprising: a third driver circuit configured to output a programming source signal to a source terminal of the programming transistor.

Example 7 is the integrated circuit of example 6, further comprising: a fourth driver circuit configured to output a programming gate signal to a gate terminal of the programming transistor.

Example 8 is the integrated circuit of example 7, wherein at least one of the four driver circuits is configured to apply a positive voltage to the programmable resistive switch element while at least another one of the four driver circuits is configured to apply a negative voltage of the same magnitude as the positive voltage to the programmable resistive switch element.

Example 9 is the integrated circuit of any one of examples 3-8, further comprising: input-output circuitry formed using transistors with a first gate oxide thickness, wherein the programming transistor has a second gate oxide thickness that is less than the first gate oxide thickness.

Example 10 is the integrated circuit of any one of examples 3-8, wherein the programming transistor is formed in a semiconductor substrate, and wherein the programmable resistive switch element is formed only in selected layers of a dielectric stack on the semiconductor substrate.

Example 11 is an integrated circuit, comprising: an array of programmable resistive switch elements; a first logic driver circuit that is coupled to a column of programmable resistive switch elements in the array; and a second logic driver circuit that is coupled to a row of programmable resistive switch elements in the array, wherein the first and second logic driver circuits drive wires configured to convey active user signals.

Example 12 is the integrated circuit of example 11, wherein the first and second logic driver circuits are tristate buffer circuits.

Example 13 is the integrated circuit of example 11, further comprising: a first shift register that stores first configuration signals; a first plurality of multiplexers configured to route a selected one of the first configuration signals from the first shift register and the active user signals to the first logic driver circuit; a second shift register that stores second configuration signals; and a second plurality of multiplexers configured to route a selected one of the second configuration signals from the second shift register and the active user signals to the second logic driver circuit.

Example 14 is the integrated circuit of any one of examples 11-13, further comprising: a programming source driver circuit that is coupled to the column of programmable resistive switch elements in the array; a programming gate driver circuit that is coupled to the row of programmable resistive switch elements in the array; a first shift register that provides signals to the programming source driver circuit; and a second shift register that provides signals to the programming gate driver circuit.

Example 15 is the integrated circuit of example 11, further comprising: a lookup table circuit; a scan chain register; and a multiplexer configured to couple a selected one of the lookup table circuit and the scan chain register to the second logic driver circuit.

Example 16 is an integrated circuit, comprising: a semiconductor substrate; a dielectric stack formed on the semiconductor substrate; and programmable resistive switch elements having non-volatile resistive elements formed in only selected metal routing layers in the dielectric stack.

Example 17 is the integrated circuit of example 16, further comprising: wires of a first type formed in the dielectric stack; and wires of a second type formed in the dielectric stack, wherein the wires of the first type are connected to the wires of the second type using a first group of the programmable resistive switch elements formed within a first localized region over the semiconductor substrate.

Example 18 is the integrated circuit of example 17, further comprising: wires of a third type formed in the dielectric stack, wherein the wires of the first type are connected to the wires of the third type using a second group of the programmable resistive switch elements formed within a second localized region over the semiconductor substrate that is non-overlapping with the first localized region.

Example 19 is the integrated circuit of any one of examples 16-18, wherein the programmable resistive switch elements are configured to implement a crossbar switch.

Example 20 is the integrated circuit of any one of examples 16-18, wherein the non-volatile resistive elements in each of the programmable resistive switch elements are connected in series and are interposed in a user data path.

Example 21 is a method of forming an integrated circuit, comprising: forming a first logic region; forming a second logic region; forming a data path configured to convey signals from the first logic region to the second logic region; and forming a programmable resistive switch element interposed in the data path, wherein the programmable resistive switch element comprises a first non-volatile resistive element and a second non-volatile resistive element coupled in series between the first logic region and the second logic region.

Example 22 is the method of example 21, wherein the first non-volatile resistive element has a cathode terminal, and wherein the second non-volatile resistive element has a cathode terminal, the method further comprising coupling the cathode terminal of the second non-volatile resistive element to the cathode terminal of the first non-volatile resistive element.

Example 23 is the method of example 22, wherein the programmable resistive switch element further comprises a programming transistor, the method further comprising coupling the programming transistor to the cathode terminals of the first and second non-volatile resistive elements.

Example 24 is the method of example 23, further comprising: forming a first driver circuit configured to drive an anode terminal of the first non-volatile resistive element; and forming a second driver circuit configured to drive an anode terminal of the second non-volatile resistive element.

Example 25 is the method of example 24, further comprising: forming a third driver circuit configured to output a programming source signal to a source terminal of the programming transistor; and forming a fourth driver circuit configured to output a programming gate signal to a gate terminal of the programming transistor.

Example 26 is an integrated circuit, comprising a first logic region; a second logic region; a data path configured to convey signals from the first logic region to the second logic region; a programmable resistive switch element interposed in the data path; and means for programming the programmable resistive switch elements.

Example 27 is the integrated circuit of example 26, wherein the programmable resistive switch element comprises a first non-volatile resistive element and a second non-volatile resistive element coupled in series between the first logic region and the second logic region.

Example 28 is the integrated circuit of example 27, wherein the means for programming the programmable resistive switch elements comprises means for selectively setting and resetting the first and second non-volatile resistive elements.

Example 29 is the integrated circuit of any one of examples 26-28, further comprising: means for routing user signals to the data path through the programmable resistive switch elements.

Example 30 is the integrated circuit of example 26, further comprising: means for routing a selected one of active user signals and programming signals to the programmable resistive switch element.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit, comprising:
   a first logic region;
   a second logic region;
   a data path configured to convey signals from the first logic region to the second logic region;
   a programmable resistive switch element interposed in the data path, wherein the programmable resistive switch element comprises a first non-volatile resistive element and a second non-volatile resistive element coupled in series between the first logic region and the second logic region, wherein the first non-volatile resistive element has a cathode terminal, wherein the second non-volatile resistive element has a cathode terminal that is coupled to the cathode terminal of the first non-volatile resistive element, wherein the programmable resistive switch element further comprises a programming transistor coupled to the cathode terminals of the first and second non-volatile resistive elements;
   a first driver circuit configured to drive an anode terminal of the first non-volatile resistive element;
   a second driver circuit configured to drive an anode terminal of the second non-volatile resistive element, wherein the first and second driver circuits are tristate buffer circuits; and
   a third driver circuit configured to output a programming source signal to a source terminal of the programming transistor, wherein the third driver circuit is not a tristate buffer circuit.

2. The integrated circuit of claim 1, further comprising:
a fourth driver circuit configured to output a programming gate signal to a gate terminal of the programming transistor.

3. The integrated circuit of claim 2, wherein at least one of the four driver circuits is configured to apply a positive voltage to the programmable resistive switch element while at least another one of the four driver circuits is configured to apply a negative voltage of the same magnitude as the positive voltage to the programmable resistive switch element.

4. The integrated circuit of claim 1, further comprising:
input-output circuitry formed using transistors with a first gate oxide thickness, wherein the programming transistor has a second gate oxide thickness that is less than the first gate oxide thickness.

5. The integrated circuit of claim 1, wherein the programming transistor is formed in a semiconductor substrate, and wherein the programmable resistive switch element is formed only in selected layers of a dielectric stack on the semiconductor substrate.

6. An integrated circuit, comprising:
a first logic region;
a second logic region;
a data path configured to convey signals from the first logic region to the second logic region;
a programmable resistive switch element interposed in the data path, the programmable resistive switch element comprises a first non-volatile resistive element and a second non-volatile resistive element coupled in series between the first logic region and the second logic region, wherein the first non-volatile resistive element has a cathode terminal, wherein the second non-volatile resistive element has a cathode terminal that is coupled to the cathode terminal of the first non-volatile resistive element, wherein the programmable resistive switch element further comprises a programming transistor coupled to the cathode terminals of the first and second non-volatile resistive elements;
a driver circuit configured to drive an anode terminal of the first non-volatile resistive element;
a multiplexer having a first input configured to receive a user signal, a second input configured to receive a programming signal that is different than the user signal, and an output that is coupled to the driver circuit.

7. The integrated circuit of claim 6, further comprising a scan chain register configured to provide the programming signal to the second input of the multiplexer.

8. The integrated circuit of claim 6, further comprising an additional multiplexer configured to provide the programming signal to the second input of the multiplexer.

9. The integrated circuit of claim 8, wherein the multiplexer and the additional multiplexer are both controlled by a program enable signal.

10. The integrated circuit of claim 9, further comprising:
a lookup table coupled to a first input of the additional multiplexer; and
a scan chain register coupled to a second input of the additional multiplexer.

11. The integrated circuit of claim 10, further comprising another multiplexer coupled between the lookup table and the scan chain register.

12. An integrated circuit, comprising:
a first logic region;
a second logic region;
a data path configured to convey signals from the first logic region to the second logic region; and
a programmable resistive switch element interposed in the data path, wherein the programmable resistive switch element comprises a first non-volatile resistive element and a second non-volatile resistive element coupled in series between the first logic region and the second logic region, wherein the first non-volatile resistive element has a cathode terminal, wherein the second non-volatile resistive element has a cathode terminal that is coupled to the cathode terminal of the first non-volatile resistive element, wherein the programmable resistive switch element further comprises a programming transistor coupled to the cathode terminals of the first and second non-volatile resistive elements, wherein the programming transistor is formed in a semiconductor substrate, wherein the programmable resistive switch element is formed only in selected layers of a dielectric stack on the semiconductor substrate, and wherein an anode terminal of the first non-volatile resistive element is formed entirely above an anode terminal of the second non-volatile resistive element in the dielectric stack.

13. The integrated circuit of claim 12, wherein the anode terminal of the first non-volatile resistive element and the anode terminal of the second non-volatile resistive element are formed in two consecutive metal routing layers in the dielectric stack.

14. The integrated circuit of claim 12, wherein the anode terminal of the first non-volatile resistive element is formed directly above the anode terminal of the second non-volatile resistive element in the dielectric stack.

15. The integrated circuit of claim 12, wherein the dielectric stack comprises a single conductive structure configured as both the cathode terminal of the first non-volatile resistive element and the cathode terminal of the second non-volatile resistive element.

16. The integrated circuit of claim 15, wherein the conductive structure is directly interposed between the anode terminal of the first non-volatile resistive element and the anode terminal of the second non-volatile resistive element in the dielectric stack.

* * * * *